United States Patent
Kim et al.

(10) Patent No.: US 8,860,055 B2
(45) Date of Patent: Oct. 14, 2014

(54) LIGHT EMITTING DEVICE

(75) Inventors: Kyong Jun Kim, Seoul (KR); Joo Hyang Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/293,886

(22) Filed: Nov. 10, 2011

(65) Prior Publication Data

US 2012/0056230 A1 Mar. 8, 2012

Related U.S. Application Data

(63) Continuation of application No. 12/844,580, filed on Jul. 27, 2010, now abandoned.

(30) Foreign Application Priority Data

Jul. 28, 2009 (KR) .................. 10-2009-0069134

(51) Int. Cl.
| | |
|---|---|
| H01L 33/00 | (2010.01) |
| H01L 33/14 | (2010.01) |
| H01L 33/38 | (2010.01) |
| H01L 33/20 | (2010.01) |

(52) U.S. Cl.
CPC .............. *H01L 33/382* (2013.01); *H01L 33/20* (2013.01); *H01L 33/145* (2013.01)
USPC .................................... 257/98; 257/E33.072

(58) Field of Classification Search
CPC ................. H01L 2924/00; H01L 2224/48247; H01L 2224/48465; H01L 2224/48091; H01L 33/20
USPC ........................................ 257/94, 98, E33.07
See application file for complete search history.

(56) References Cited

U.S. PATENT DOCUMENTS

| | | | |
|---|---|---|---|
| 2005/0211993 A1 | 9/2005 | Sano et al. | |
| 2006/0011923 A1 | 1/2006 | Eisert et al. | |
| 2006/0186418 A1 | 8/2006 | Edmond et al. | |
| 2006/0273327 A1 | 12/2006 | Im | |
| 2007/0145381 A1 | 6/2007 | Unno et al. | |
| 2008/0006838 A1* | 1/2008 | Hattori et al. | 257/98 |
| 2008/0315224 A1 | 12/2008 | Kang et al. | |
| 2009/0072257 A1* | 3/2009 | Unno et al. | 257/98 |
| 2010/0072487 A1* | 3/2010 | Tsai et al. | 257/86 |
| 2010/0208763 A1 | 8/2010 | Engl et al. | |

FOREIGN PATENT DOCUMENTS

| | | |
|---|---|---|
| CN | 1988195 A | 6/2007 |
| CN | 101393956 A | 3/2009 |
| DE | 10 2007 029 3 A1 | 11/2008 |

(Continued)

OTHER PUBLICATIONS

Full translation of KR-10-2009-0027329-A dated Mar. 17, 2009.

(Continued)

*Primary Examiner* — Tony Tran
(74) *Attorney, Agent, or Firm* — Birch, Stewart, Kolasch & Birch

(57) ABSTRACT

A light emitting device according to the embodiment includes a first conductive semiconductor layer; an active layer under the first conductive semiconductor layer; a second conductive semiconductor layer under the active layer; a current blocking region under the second conductive semiconductor layer; a second electrode layer under the second conductive semiconductor layer and the current blocking region; and a first electrode layer including a protrusion protruding toward the first conductive semiconductor layer arranged, on the first conductive semiconductor layer.

16 Claims, 8 Drawing Sheets

(56) References Cited

FOREIGN PATENT DOCUMENTS

| | | | |
|---|---|---|---|
| JP | 2004-186544 | * | 7/2004 |
| JP | 2004-186544 A | | 7/2004 |
| KR | 10-2008-0076248 A | | 8/2008 |
| KR | 10-2009-0027329 A | | 3/2009 |
| KR | 10-2009-0027329 A | | 5/2009 |
| KR | 10-2009-0076064 A | | 7/2009 |
| WO | WO 2007/089460 A1 | | 8/2007 |
| WO | 2007/124708 A1 | | 11/2007 |

OTHER PUBLICATIONS

Full translation of KR-10-2009-0049691-A dated May 19, 2009.
Full translation of KR-10-2009-0076064-A dated Jul. 13, 2009.
Machine translation of JP-2004-186544-A dated Jul. 2, 2004.

* cited by examiner

LIGHT EMITTING DEVICE

CROSS-REFERENCE TO RELATED APPLICATIONS

The present application is a continuation of U.S. application Ser. No. 12/844,580, filed on Jul. 27, 2010, now abandoned which claims priority under 35 U.S.C. §119(a) of Korean Patent Application No. 10-2009-0069134 filed on Jul. 28, 2009, each of which is hereby incorporated by reference in its entirety.

BACKGROUND

Embodiments relate to a light emitting device.

A light emitting diode (LED) is frequently used as a sort as the light emitting device.

These days, a luminance of the light emitting diode (LED) is increased, so that the light emitting diode has been used as a light source for a display, an automobile, and lighting unit. In addition, the light emitting diode is implemented as a light emitting device having an excellent efficiency, which emits a white light by using a fluorescent material, or combining light emitting diodes, which produce various colors.

The light emitting diode having a light emitting structure layer formed by stacking a first conductive semiconductor layer, an active layer, and a second conductive semiconductor layer, generates light from the active layer, using power that is applied. For example, the first conductive semiconductor layer may be an n-type semiconductor layer and the second conductive semiconductor layer may be a p-type semiconductor layer, on the contrary, the first conductive semiconductor layer may be the p-type semiconductor layer and the second conductive semiconductor layer may be the n-type semiconductor layer.

Meanwhile, in the light emitting diode, because of a high resistance component of the first conductive semiconductor layer, current is not uniformly supplied over the entire active layer, and is concentrated and, mostly flows to and around an electrode layer part formed on the first conductive semiconductor layer, and its adjacent region. Due to the limited current flow as mentioned above, forward voltage of the light emitting diode is increased, so that there is a problem that current efficiency is reduced.

SUMMARY

Embodiments provide a light emitting device having new structure.

Embodiments provide a light emitting device with an improved current efficiency and light efficiency by allowing current to flow to the broad region of the active layer.

The light emitting device according to the embodiments includes a first conductive semiconductor layer; an active layer under the first conductive semiconductor layer; a second conductive semiconductor layer under the active layer; a current blocking region under the second conductive semiconductor layer; a second electrode layer under the second conductive semiconductor layer and the current blocking region; and a first electrode layer containing a protrusion protruding toward the first conductive semiconductor layer arranged on the first conductive semiconductor layer.

The light emitting device according to the embodiments includes a first conductive semiconductor layer; an active layer under the first conductive semiconductor layer; a second conductive semiconductor layer under the active layer; a second electrode layer under the second conductive semiconductor layer; and a first electrode layer having a pad unit, and an electrode unit connected to the pad unit on the first conductive semiconductor layer, in which the electrode unit includes a body, and a protrusion arranged under the body; and the protrusion is extended along the body.

DETAILED DESCRIPTION OF THE EMBODIMENTS

Figure 1:
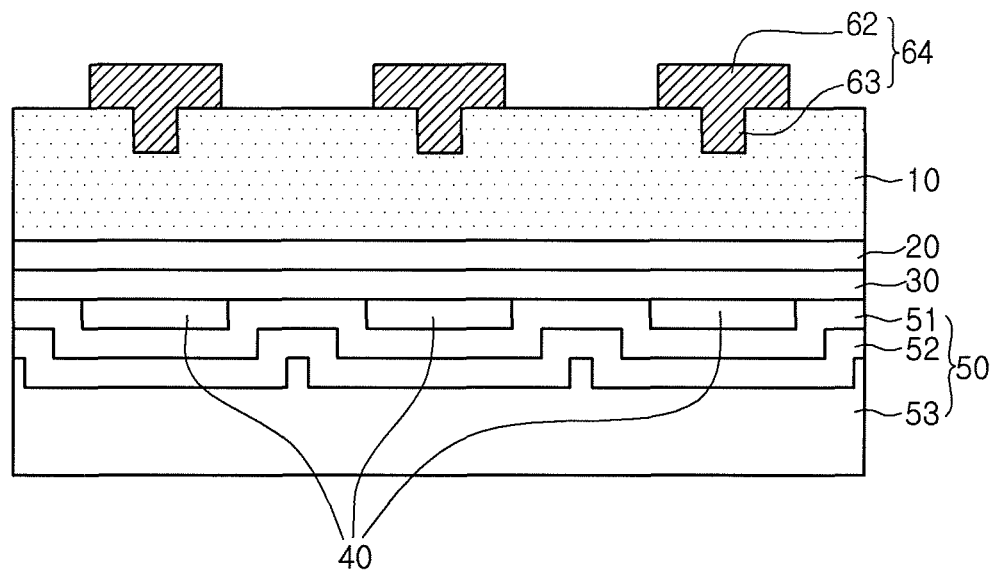
FIG. 1 is a cross-sectional view of a light emitting device according to a first embodiment.

In describing embodiments, it will be understood that when each layer (or film), region, pattern, or structure is described to as being formed 'on' or 'under' each layer (or film), region, pattern, or structure, "on" or "under" can be formed "directly" or via other layer (indirectly)". In addition, word "on," or "under," are will be described based on the accompanying drawings.

In the drawings, the thickness or size of each layer is exaggerated, omitted, or schematically illustrated for convenience in description and clarity. Also, a size of each component does not entirely reflect an actual size.

Hereinafter, a light emitting device according to embodiments will be described with reference to the accompanying drawings.

Figure 2:
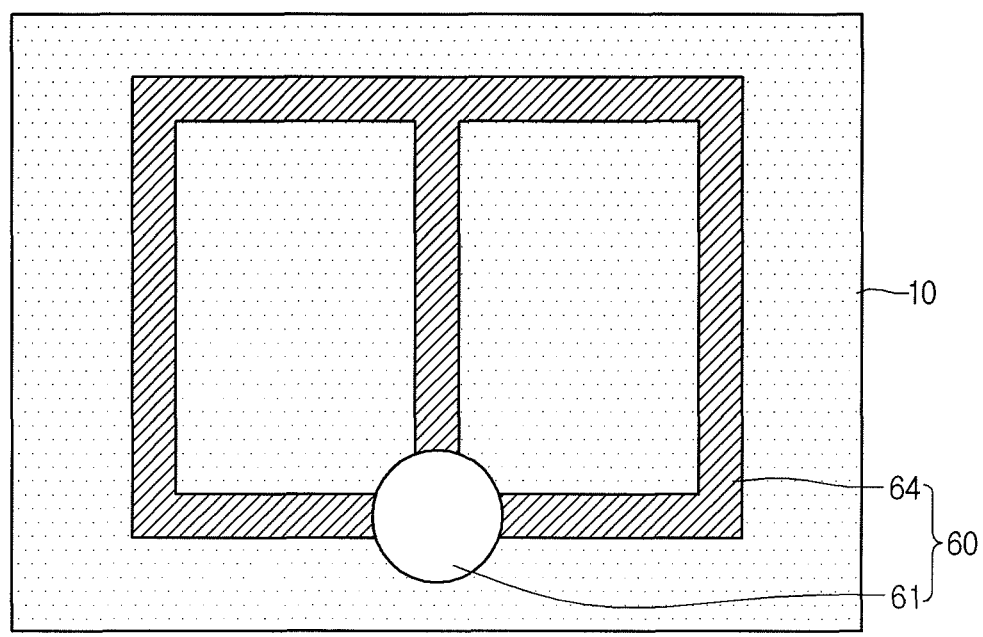
FIG. 2 is a diagram of a light emitting device as viewed from the upper direction according to a first embodiment.

FIG. 1 is a cross-sectional view of a light emitting device according to a first embodiment, and FIG. 2 is a diagram of a light emitting device according to a first embodiment, seen from above.

Referring to FIG. 1 and FIG. 2, the light emitting device according to the first embodiment includes a light emitting structure layer including a first conductive semiconductor layer 10, an active layer 20, and a second conductive semiconductor layer 30. In addition, a first electrode layer 60 is formed on the first conductive semiconductor layer 10 and a second electrode layer 50 is formed under the second conductive semiconductor layer 30.

For example, the first conductive semiconductor layer 10 may include a n-type semiconductor layer, and the n-type semiconductor layer may be made of a semiconductor material, which is, for example, selected from InAlGaN, GaN, AlGaN, AlInN, InGaN, AlN, InN, and the like, in which the semiconductor material has a formula, $In_xAl_yGa_{1-x-y}N$ ($0 \le x \le 1$, $0 \le y \le 1$, $0 \le x+y \le 1$), and may be doped with a n-type dopant, such as Si, Ge, Sn, and the like.

For example, the second conductive semiconductor layer 30 may be implemented as a p-type semiconductor layer, and the p-type semiconductor layer may be made of a semiconductor material, which is for example selected from InAlGaN, GaN, AlGaN, InGaN, AlInN, AlN, InN, and the like, in which the semiconductor material has a formula, $In_xAl_yGa_{1-x-y}N$ ($0 \le x \le 1$, $0 \le y \le 1$, $0 \le x+y \le 1$), and may be doped with a p-type dopant, such as Mg, Zn, Ca, Sr, Ba, and the like.

And, for example, the active layer 20 may be made of a semiconductor material having a formula, $In_xAl_yGa_{1-x-y}N$ ($0 \le x \le 1$, $0 \le y \le 1$, $0 \le x+y \le 1$). If the active layer 20 is formed in the multiple quantum well structure, the active layer 20 may be formed by stacking a plurality of well layers and a plurality of barrier layers, and, for example, may be formed in the order of InGaN well layer/GaN barrier layer cycle.

A clad layer (not shown) doped with the n-type or p-type dopant may be formed on the active layer 20 and/or under the active layer 20. The clad layer (not be shown) may be implemented as AlGaN layer or InAlGaN layer.

Although the embodiment exemplifies when the first conductive semiconductor layer 10 includes the n-type semiconductor layer and the second conductive semiconductor layer 30 includes the p-type semiconductor layer, the first conductive semiconductor layer 10 may include the p-type semiconductor layer and the second conductive semiconductor layer 30 may include the n-type semiconductor layer.

In addition, a third conductive semiconductor layer different from the second conductive semiconductor layer 10 may be formed between the second conductive semiconductor layer 30 and the second electrode layer 50. For example, when the second conductive semiconductor layer 30 includes the p-type semiconductor layer, the third conductive semiconductor layer includes the n-type semiconductor layer, if the second conductive semiconductor layer 30 includes the n-type semiconductor layer, the third conductive semiconductor layer includes the p-type semiconductor layer.

The first electrode layer 60 overlaps the second electrode layer 50 in a vertical direction.

The first electrode layer 60 includes a pad unit 61 and an electrode unit 64, and the electrode unit 64 includes a body 62 arranged on the first conductive semiconductor layer 10 and the protrusion 63 protruding from the body 62 toward the first conductive semiconductor layer 10.

The bottom of the body 62 is in contact with the first conductive semiconductor layer 10 and the side and bottom of the protrusion 63 is in contact with the first conductive semiconductor layer 10.

The pad unit 61 provides a wire-bonding region for connecting the first conductive semiconductor layer 10 with an external power supply, and the electrode unit 64 allows power provided through the pad unit 61 to widely and uniformly flow to the broad region of the first conductive semiconductor layer 10.

The electrode unit 64 linearly extends on the first conductive semiconductor layer 10, and for example may be arranged in a window shape including at least one opening surrounded by the electrode unit 64 as depicted in FIG. 2.

Figure 3:
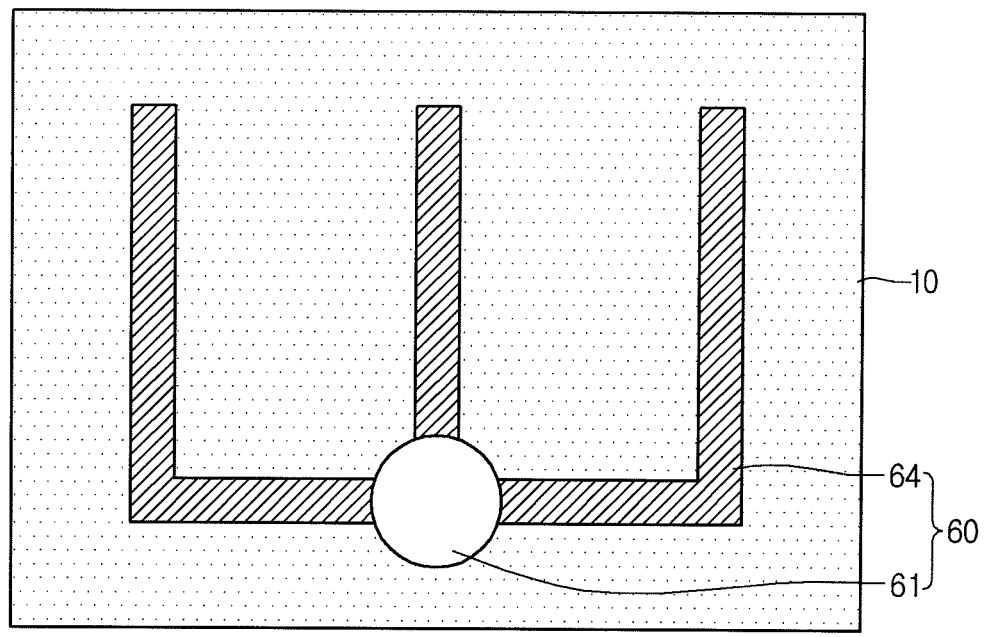
FIG. 3 is a cross-sectional view of a light emitting device according to a second embodiment.
Figure 4:
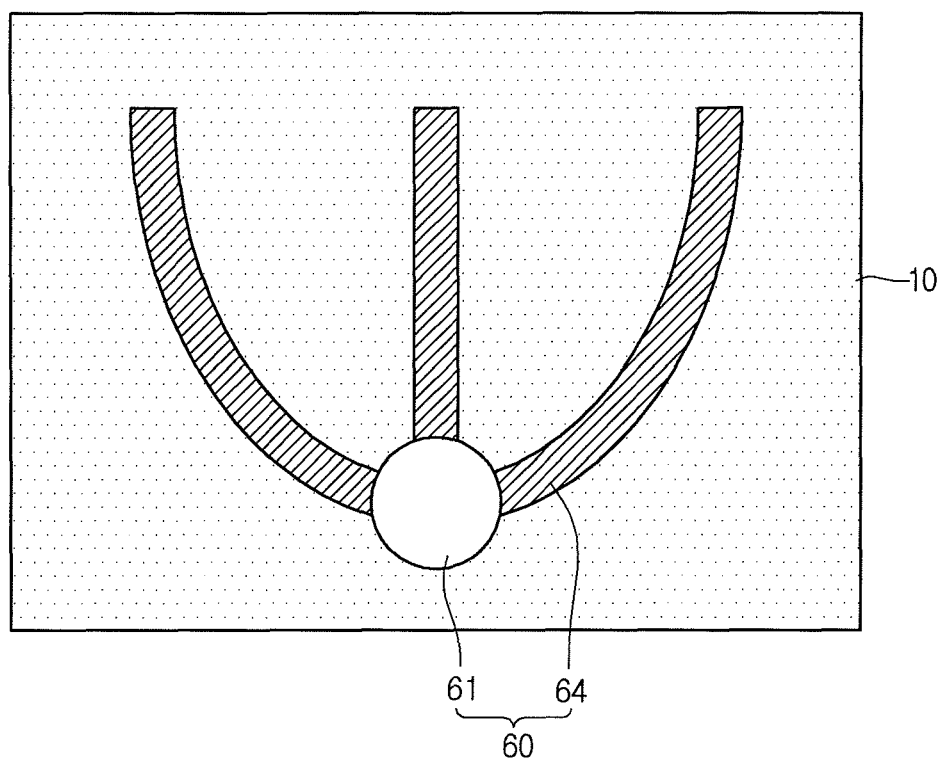
FIG. 4 is a cross-sectional view of a light emitting device according to a third embodiment.

FIG. 3 and FIG. 4 are diagrams illustrating other types of the first electrode layer in the light emitting device according to the embodiment.

As shown in FIG. 3 and FIG. 4, the first electrode layer 60 may include the electrode unit 64, which is divided into three parts, and then extends, and the shape of the electrode unit 64 on the surface includes a straight line shape or curve shape.

Although the embodiment exemplifies when the electrode unit 64 is divided like fingers, it may be designed in various shapes.

In addition, though not shown, a plurality of the pad units 61 may be formed, and the electrode unit may be connected to each pad unit.

Figure 5:
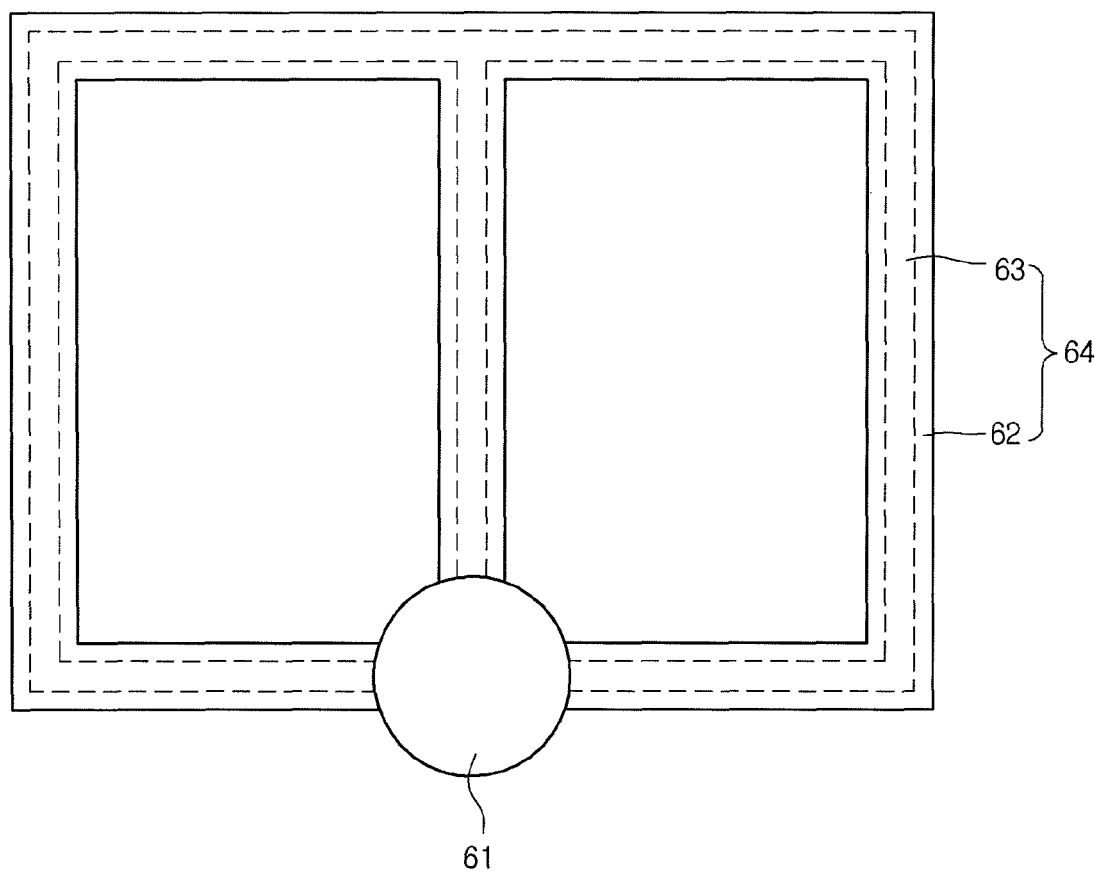
FIG. 5 is a diagram showing the detailed shape of the electrode unit shown in FIG. 2.

FIG. 5 is a diagram showing the detailed shape of the electrode unit shown in FIG. 2.

Referring to FIG. 5, the first electrode layer 60 includes the pad unit 61 and the electrode unit 64, and the electrode unit 64 includes the body 62 and the protrusion 63.

The protrusion 63 may extend from the pad unit 61 along the body 62, and may be formed in a shape corresponding to the body 62. For example, as shown in FIG. 2 and FIG. 5, the body 62 is formed in the window shape, the protrusion 63 may be correspondingly also formed in the window shape, as depicted in FIG. 4, if the body 62 is divided like fingers, the protrusion 63 may also be formed in the finger shape.

For the light emitting device according to the first embodiment, the electrode unit 64 has the body 62 and the protrusion 63, so that the contact region between the electrode unit 64 and the first conductive semiconductor layer 10 is increased, thereby reducing the resistance between the electrode unit 64 and the first conductive semiconductor layer 10. In other words, the protrusion 63 allows power transmitted through the body 62 to more effectively flow throughout the first conductive semiconductor layer 10.

The protrusion 63 may be arranged under the center of the body 62 and may be smaller in width than the body 62.

Meanwhile, current blocking region 40 is formed under the second conductive semiconductor layer 30 and the second electrode layer 50 is formed under the second conductive semiconductor layer 30 and the current blocking region 40.

The current blocking region 40 may be made of a material having a low electrical conductivity or electrical insulation property. For example, the current blocking region 40 may be made of an electrical insulation material, such as silicon oxide ($SiO_2$), or the material that has a schottky contact property with the second conductive semiconductor layer 30. In addition, the current blocking region 40 may be a space containing air.

The second electrode layer 50 includes an ohmic contact layer 51, a reflection layer 52, and a conductive support substrate 53.

For example, the ohmic contact layer 51 may be made of the material containing at least any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, or Ni/$IrO_x$/Au/ITO.

In addition, the reflection layer 52 may be made of the material containing Ag or Al, and the conductive support substrate 53 may be made of the metal containing at least any one of Cu, Mo, Ni, Cr, Ti, Al, Pt, and Au, or the electrical conductive semiconductor substrate containing at least any one of Si, Ge, GaAs, ZnO, SiC, SiGe, or GaN.

The first electrode layer 60 is arranged with at least a portion overlapping the current blocking region 40 in a vertical direction. In addition, at least one part of the protrusion 63 is overlapped in the vertical direction with the current blocking region 40.

Current scarcely flows in the current blocking region 40, so that the current between the first electrode layer 60 and the second electrode layer 50 flows to the broad region due to the current blocking region 40.

Specifically, the light emitting device according to the first embodiment includes the protrusion 63 in order to reduce the resistance between the body 62 and the first conductive semiconductor layer 10, so that there is a chance that the current flow between the first electrode layer 60 and the second electrode layer 50 can be more concentrated due to the protrusion 63.

However, because the light emitting device according to the first embodiment includes the protrusion 63 and the current blocking region 40, the phenomenon, in which the current flow is concentrated between the first electrode layer 60 and the second electrode layer 50, can be prevented, as well as the resistance between the body 62 and the first conductive semiconductor layer 10 can be reduced.

Figure 6:
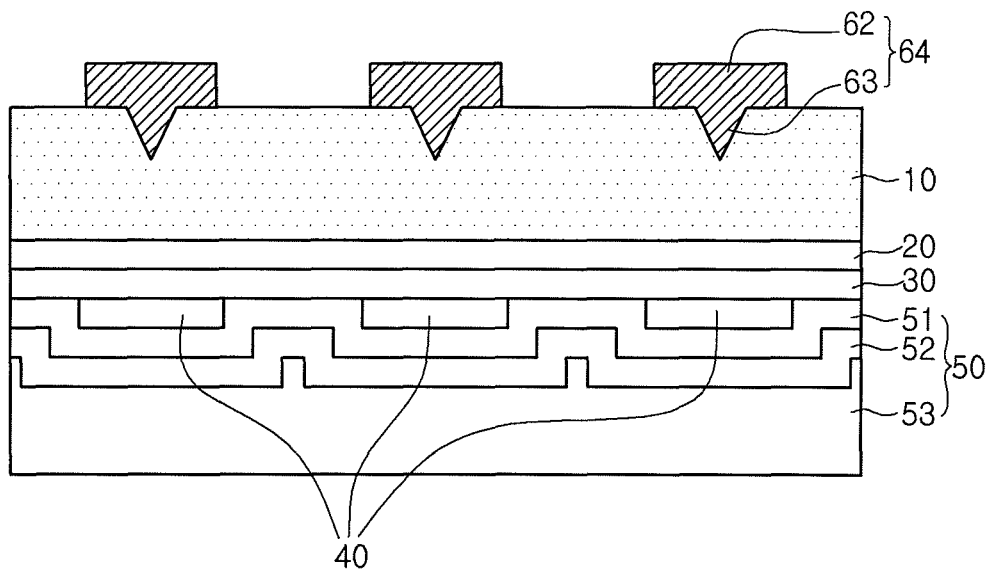
FIG. 6 is a cross-sectional view of the light emitting device according to the second embodiment.

FIG. 6 is a cross-sectional view of the light emitting device according to the second embodiment.

The explanation, which is duplicated with the explanation about the light emitting device according to the first embodiment as mentioned above, for the explanation of the light emitting device according to the second embodiment, will be omitted.

Referring to FIG. 6, the light emitting device according to the second embodiment includes the electrode unit 64 having the protrusion 63 with triangular cross-section.

The protrusion 63 with rectangular cross-section is illustrated in the first embodiment, but the protrusion 63 with triangular cross-section is illustrated in the light emitting device according to the second embodiment. In other words, the protrusion 63 in the light emitting device according to the second embodiment includes a first inclined surface and a second inclined surface.

Even if it is not shown, the cross-section shape of the protrusion 63 can be possible to form a type of a semicircle.

Figure 7:
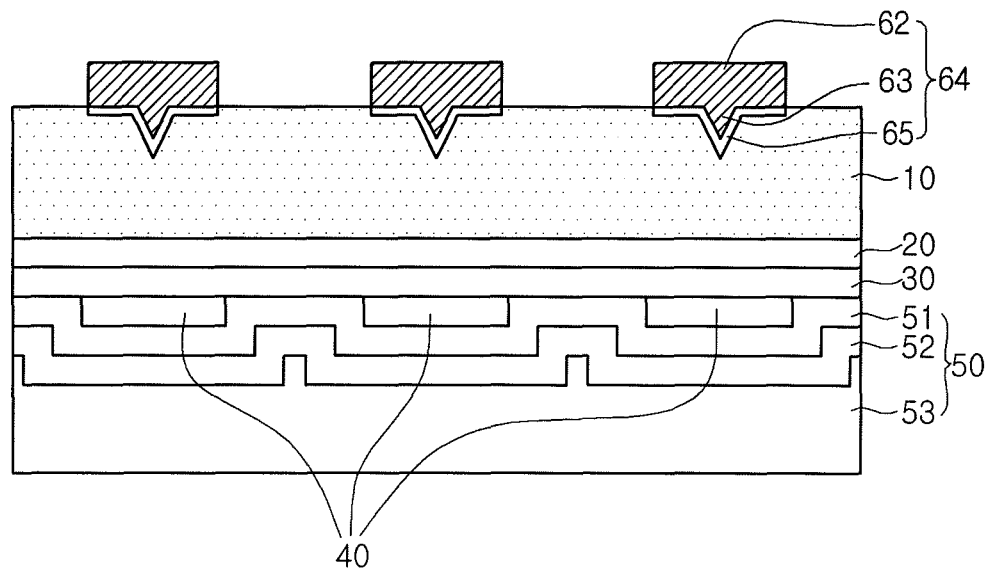
FIG. 7 is a cross-section view of the light emitting device according to the third embodiment.

FIG. 7 is a cross-section view of the light emitting device according to the third embodiment.

The explanation, which is duplicated with the explanation about the light emitting device according to the first embodiment or the second embodiment as mentioned above, for the explanation of the light emitting device according to the third embodiment, will be omitted.

Referring to FIG. 7, the light emitting device according to the third embodiment includes the electrode unit 64 having the protrusion 63 with triangular cross-section. And, a reflection electrode unit 65 is formed between the protrusion 63 and the first conductive semiconductor layer 10.

The reflection electrode unit 65 allow optical extraction efficiency of the light emitting device to increase by reflection the incident light from the under side of the electrode unit 64 of light generated in the active layer 20. The reflection electrode unit 65 may be made of the metal with a high light reflectance, such as Ag or Al.

Specifically, the reflection electrode unit 65 can effectively reflect light progressing from the active layer 20 by having a constant angle of inclination according to the active layer 20 because the reflection electrode unit 65 is formed on the inclined surface of the protrusion 63.

The reflection electrode unit 65 may be formed in the bottom of the body 62 as well as the inclined surface of the protrusion 63.

As mentioned above, the light emitting device according to the embodiments can supply current of a low resistance to the broad region of the first conductive semiconductor layer 10 through the electrode unit 64 including the protrusion 63.

In addition, for the light emitting device according to the embodiments, current should be able to supply to the broad region of the active layer 20 by arranging the current blocking region 40 on the overlapped region in the vertical direction with the electrode unit 64, so that a electro static discharge (ESD) property of the light emitting device can be improved. In addition, a heat emission generated by concentrating current to the specific region can be prevented so that a reliability of device by the problem according to the heat emission can be improved.

In addition, the light emitting device according to the embodiments can be implemented by a low driving voltage due to the low resistance, so that the electrical properties of the light emitting device can be improved.

The embodiments can provide the light emitting device with a new structure.

The embodiments can provide the light emitting device, that has an improved current efficiency and light efficiency by flowing current to the broad region of the active layer.

Figure 8:
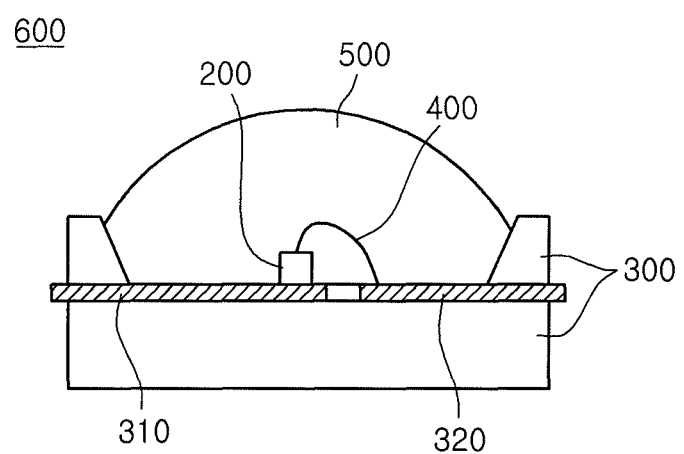
FIG. 8 is a diagram illustrating a light emitting device package including the light emitting device according to the embodiments.

FIG. 8 is a diagram illustrating a light emitting device package including the light emitting device according to the embodiments.

Referring to FIG. 8, the light emitting device package 600 according to the embodiments includes a package body 300, a first conductive layer 310 and a second conductive layer 320 formed on the package body 300, a light emitting device 200 that forms on the package body 300 and is electrically connected to the first conductive layer 310 and the second conductive layer 320, and a molding member 500 covering the light emitting device 200.

The package body 300 may be made of a silicon material, a synthetic resin material, or a metal material, and the inclined surface may have a slope around the light emitting device 200.

The first conductive layer 310 and the second conductive layer 320 are electrically separated each other, and supply power to the light emitting device 200. In addition, the first conductive layer 310 and the second conductive layer 320 may play a role in increasing light efficiency by reflection light generated by the light emitting device 200, and also play a role in discharging heat generated by the light emitting device 200 to the outside.

The light emitting device 200 may be formed on the package body 300, or on the first conductive layer 310 or the second conductive layer 320.

The light emitting device 200 may be electrically connected to the first conductive layer 310 and/or the second conductive layer 320 through a wire 400, and embodiments illustrate that one wire is used.

The molding member 500 can protect the light emitting device 200 by covering the light emitting device 200. In addition, the molding member 500 includes a fluorescence substance, thereby changing a wavelength of light emitted from the light emitting device 200.

The light emitting device package 600 according to the embodiments can have an excellent light efficiency by using the light emitting device 200 with an excellent light extraction efficiency and current injection efficiency.

A plurality of the light emitting device packages 600 are arrayed on the substance, and an optical waveguide, a prism sheet, a diffusion sheet, a fluorescent sheet, and the like as an optical member can be arranged in the path of light emitted from the light emitting device package 600. The light emitting device package, the substance, and the optical member may function as a backlight unit or a lighting unit, and the lighting system can for example include the backlight unit, the lighting unit, the indicator, a lamp, a streetlight.

Figure 9:
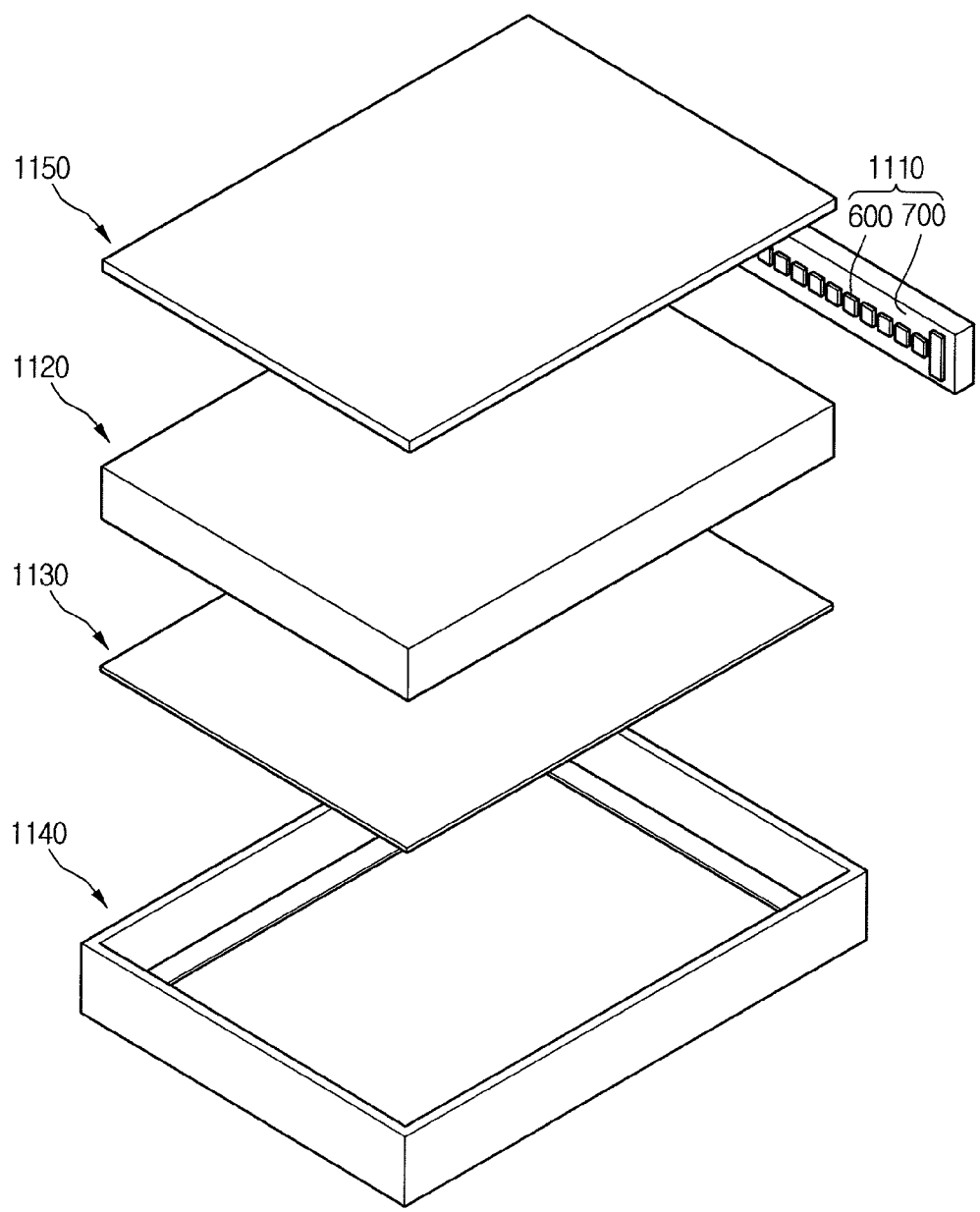
FIG. 9 is a diagram illustrating the backlight unit using the light emitting device package or the light emitting device according to the embodiment.

FIG. 9 is a diagram illustrating the backlight unit using the light emitting device package or the light emitting device according to the embodiment. However, the backlight unit 1100 in FIG. 9 is one example of the lighting system, and is not limited thereto.

Referring to FIG. 9, the backlight unit 1100 may include a bottom frame 1140, a light guide member 1120 arranged inside the bottom frame 1140, a light emitting module 1110 arranged on the bottom or at least one side of the light guide member 1120. In addition, a reflection sheet 1130 may be arranged under the light guide member 1120.

The bottom frame 1140 may be a box with the top one to receive the light guide member 1120, the light emitting module 1110, and the reflection sheet 1130, and may be made of a metal or resin, but is be limited thereto.

The light emitting module 1110 may include a substrate 700, and a plurality of the light emitting device package 600 mounted on the substrate 700. The plurality of the light emitting device package 600 may supply light to the light guide member 1120. Although the embodiments exemplifies that the light emitting device package 600 is formed on the substrate 700 for the light emitting module 1110, but the light emitting device 200 according to the embodiment can be directly formed.

As shown in FIG. 9, the light emitting module 1110 may be arranged on at least any one of the inner sides of the bottom frame 1140, thereby supplying light toward at least one inner side of the light guide member 1120.

However, the light emitting module 1110 may be arranged under the bottom frame 1140, thereby supplying light toward the bottom side of the light guide member 1120, and it can be possible to variously change according to the design of the backlight unit 1100, so that it will not be limited thereto.

The light guide member 1120 may be arranged inside the bottom frame 1140. The light guide member 1120 allows the light supplied from the light emitting module 1110 to be combined to form one surface, thereby guiding a display panel (not shown).

The light guide member 1120 may be for example the light guide panel (LGP). For example, the light guide panel may be made of one of a kind of acryl resin, such as polymethyl metaacrylate (PMMA), polyethylene terephthlate (PET), poly carbonate (PC), COC, and polyethylene naphthalate (PEN) resins.

The optical sheet 1150 may be arranged on the light guide member 1120.

The optical sheet 1150 may include at least one of, for example, the diffusion sheet, a condensing sheet, a luminance increase sheet, and the fluorescence sheet. For example, laminating the diffusion sheet, the condensing sheet, the luminance increase sheet, and the fluorescence sheet may form the optical sheet 1150. In this case, the diffusion sheet 1150 is able to evenly diffuse light exited from the light emitting module 1110, and the diffused light may be concentrated to the display panel (not be shown) by the condensing sheet. At this time, the exited light from the condensing sheet is a randomly polarized light, and the luminescence increase sheet is able to increase a degree of polarization of the light exited from the condensing sheet. The condensing sheet may be for example a horizontal or/and a vertical prism sheet. In addition, the luminance increase sheet may be for example a dual brightness enhancement film. In addition, the fluorescence sheet may be a transparency plate or film containing the fluorescent substance.

The reflection sheet 1130 may be arranged under the light guide member 1120. The reflection sheet 1130 is able to reflect light emitted through the bottom of the light guide member 1120 toward the exit surface of the light guide member 1120.

The reflection sheet 1130 may be made of the resin material having a good reflectance, for example, PET, PC, PVC, resin, and the like, but will not be limited thereto.

Figure 10:
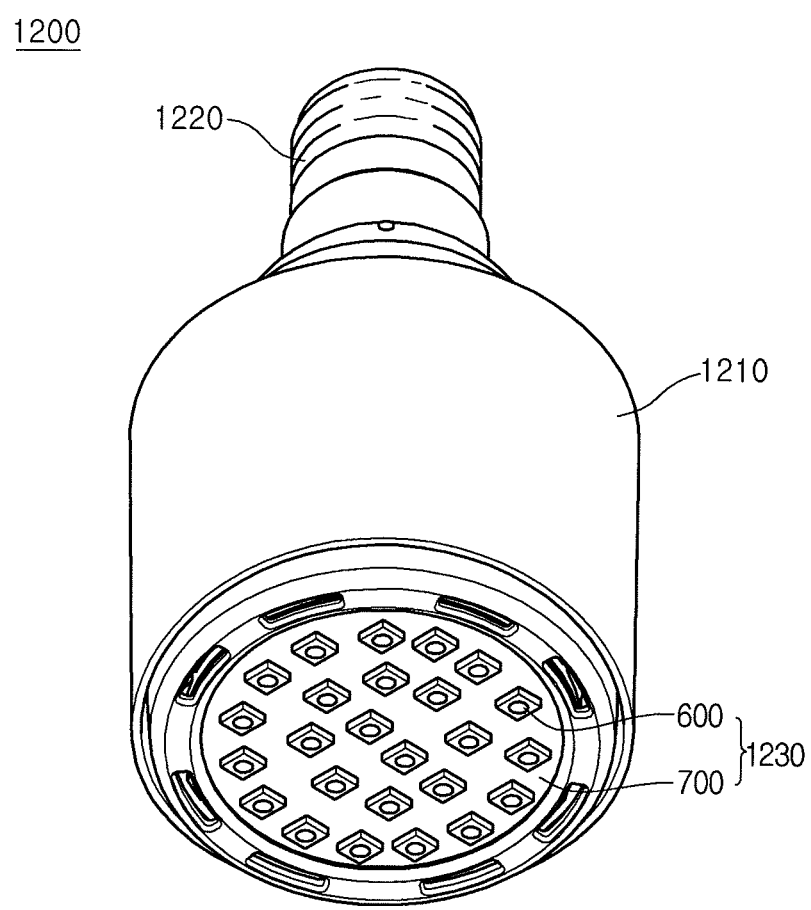
FIG. 10 is a perspective view of the lighting unit using the light emitting device or the light emitting device package according to the embodiments.

FIG. 10 is a perspective view of the lighting unit using the light emitting device or the light emitting device package according to the embodiments. However, the lighting unit 1200 in FIG. 10 is one example of the lighting system, but will not be limited thereto.

Referring to FIG. 10, the lighting unit 1200 may include a case body 1210, a light emitting module 1230 formed in the case body 1210, and a connection terminal 1220 that is formed in the case body 1210 and is supplied with power from the outside power supply.

The case body 1210 may be preferably made of the material with a good radiant heat property, and for example, may be made of the metal material or the resin material.

The light emitting module 1230 may include the substrate 700, and at least one the light emitting device package 600 mounted on the substrate 700. The embodiments illustrate that the light emitting device package 600 is formed on the substrate 700 for the light emitting module 1110, but the light emitting device 200 according to the embodiment can be directly formed.

The substrate 700 may be the substrate printed with a circuit pattern on an insulator, and for example, may include a general printed circuit broad (PCB), a metal core PCB, a flexible PCB, a ceramic PCB, and the like.

In addition, the substrate 700 may be made of the material that effectively reflects light, or the material having colors, that effectively reflect light on its surface, for example, a white color, a silver color, and the like.

At least one of the light emitting device package 600 may be mounted on the substrate 700. The light emitting device package 600 may include at least one of the light emitting diode (LED), respectively. The light emitting diode may include a colored light emitting diode that emit a colored light, such as a red, a green, a blue, or a white, respectively, and a UV light emitting diode that emits ultraviolet (UV).

The light emitting module 1230 may be arranged to have combinations of various light emitting diodes in order to achieving a luminance and the color sense. For example, it can be arranged in order to securing a high color rendering by the combination of the white light emitting diode, the red light emitting diode, and the green light emitting diode. In addition, the fluorescence sheet may be arranged on the progressing path of light emitted from the light emitting module 1230, and the fluorescence sheet is able to change the wavelength of light emitted from the light emitting module 1230. For example, if light emitted from the light emitting module 1230 has a blue wavelength range, the fluorescence sheet can include a yellow fluorescence substance, and light emitted from the light emitting module 1230 pass through the fluorescence sheet, and is finally shown as the white light.

The connection terminal 1220 is able to supply power by electrically connecting to the light emitting module 1230. As depicted in FIG. 10, the connection terminal 1220 is inserted and coupled with the outside power supply in a socket type, however it will not be limited thereto. For example, the connection terminal 1220 is formed in a pin type, and then inserted into the outside power supply, or may be also connected to the outside power supply by wiring.

At least any one of the light guide member, the diffusion sheet, the condensing sheet, the luminance increase sheet, and the fluorescence sheet on the progressing paths of light emitted from the light emitting module may be arranged on the lighting system as mentioned above, so that the desired optical effect can be achieved.

As mentioned above, the lighting system can have an excellent light efficiency by including the light emitting device or the light emitting device package with good light extraction efficiency and current injection efficiency according to the embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a second electrode layer;
   a light emitting structure comprising an n-type semiconductor layer, a p-type semiconductor layer, and an active layer between the n-type semiconductor layer and the p-type semiconductor layer;
   at least one current blocking layer disposed between the second electrode layer and the light emitting structure;
   a first electrode layer including a body and a protrusion extending from the body towards the n-type semiconductor layer with a triangular cross-section; and
   a reflection layer formed between the protrusion of the first electrode layer and the n-type semiconductor layer, the reflection layer being formed at a bottom surface of the body and at an inclined surface of the protrusion,
   wherein a width of the reflection layer is identical to a width of the first electrode layer,
   wherein the reflection layer directly contacts the n-type semiconductor layer,
   wherein the n-type semiconductor layer has a recess having an inclined surface, and
   wherein the reflection layer directly contacts the inclined surface of the recess;
   wherein the first electrode layer has a first bottom surface with the protrusion and a second bottom surface surrounding the first bottom surface, and
   wherein the reflection layer has a first portion between the recess of the n-type semiconductor layer and the first bottom surface of the first electrode layer and a second portion between a portion of a top surface of the n-type semiconductor layer and the second bottom surface of the first electrode layer; and
   wherein the current blocking layer comprises an oxide-based material.

2. The light emitting device according to claim 1, wherein the first electrode layer includes a pad unit and at least one electrode unit electrically connected to the pad unit.

3. The light emitting device according to claim 2, wherein the at least one electrode unit has a closed loop.

4. The light emitting device according to claim 3, wherein the protrusion has a closed loop along a length direction of the at least one electrode unit and is disposed under a bottom surface of the at least one electrode unit.

5. The light emitting device according to claim 2, wherein the at least one electrode unit has a finger shape diverged from the pad unit.

6. The light emitting device according to claim 5, wherein the protrusion has a finger shape corresponding to the at least one electrode unit.

7. The light emitting device according to claim 2, wherein an upper portion of the protrusion has a smaller width than that of the electrode unit and has a greater width than that of a lower portion of the protrusion.

8. The light emitting device according to claim 2, wherein the at least one current blocking layer overlaps the at least one electrode unit, respectively, in a vertical direction.

9. The light emitting device according to claim 2, wherein the at least one current blocking layer includes a plurality of current blocking layers spaced from each other.

10. The light emitting device according to claim 9, wherein the at least one electrode unit includes a plurality of electrode units spaced apart from each other.

11. The light emitting device according to claim 10, wherein the plurality current blocking layers each has a width substantially similar to that of the plurality of electrode units.

12. The light emitting device according to claim 10, wherein the plurality of electrode units are disposed in parallel with each other.

13. The light emitting device according to claim 1, wherein the protrusion extends from a bottom region in the light emitting structure.

14. The light emitting device according to claim 1, wherein the at least one current blocking layer has an electrical insulation property, a low electrical conductivity or a schottky contact property.

15. The light emitting device according to claim 1, wherein the n-type semiconductor layer has a shape corresponding to the inclined surface of the protrusion.

16. The light emitting device according to claim 1, wherein the reflection layer directly contacts the n-type semiconductor layer.

* * * * *